United States Patent [19]

Nakajima et al.

[11] Patent Number: 4,696,004
[45] Date of Patent: Sep. 22, 1987

[54] LOGIC ANALYZER

[75] Inventors: Takayuki Nakajima, Gyoda; Tetsuo Aoki, Kohnosu; Katsumi Kobayashi, Gyoda; Noboru Akiyama, Kumagaya, all of Japan

[73] Assignee: Takeda Riken Kogyo Kabushikikaisha, Tokyo, Japan

[21] Appl. No.: 737,466

[22] Filed: May 24, 1985

[30] Foreign Application Priority Data

May 28, 1984 [JP] Japan .............................. 59-108921
May 30, 1984 [JP] Japan .............................. 59-110380

[51] Int. Cl.⁴ .......................................... G06F 11/00
[52] U.S. Cl. .................................. 371/25; 371/29
[58] Field of Search .................... 371/25, 29, 16, 15, 371/18, 22; 324/73 R, 73 AT

[56] References Cited

U.S. PATENT DOCUMENTS 4,425,643  1/1984  Chapman et al. .
4,484,329 11/1984  Slamka ................................. 371/25
4,546,467 10/1985  Yamamoto .......................... 371/25
4,574,354  3/1986  Mihalik ............................... 371/25
4,583,223  4/1986  Inoue .................................. 371/25
4,601,033  7/1986  Whelan ............................... 371/25
4,604,746  8/1986  Blum .................................. 371/25

Primary Examiner—Michael R. Fleming
Attorney, Agent, or Firm—Staas & Halsey

[57] ABSTRACT

Logic output data of a plurality of channels simultaneously obtained from a circuit under test are sequentially input in a memory, and after inputting a predetermined amount of such data, they are compared with corresponding expected values. The input data are divided into blocks, each including a plurality of data. Whether a mismatch is present in the comparison results for each block is indicated by a respective block element, and such block elements are displayed in a predetermined arrangement. It is also possible to provide a conventional list display including the input timing corresponding to the comparison results in which a mismatch is present.

12 Claims, 13 Drawing Figures

FIG. 1
PRIOR ART

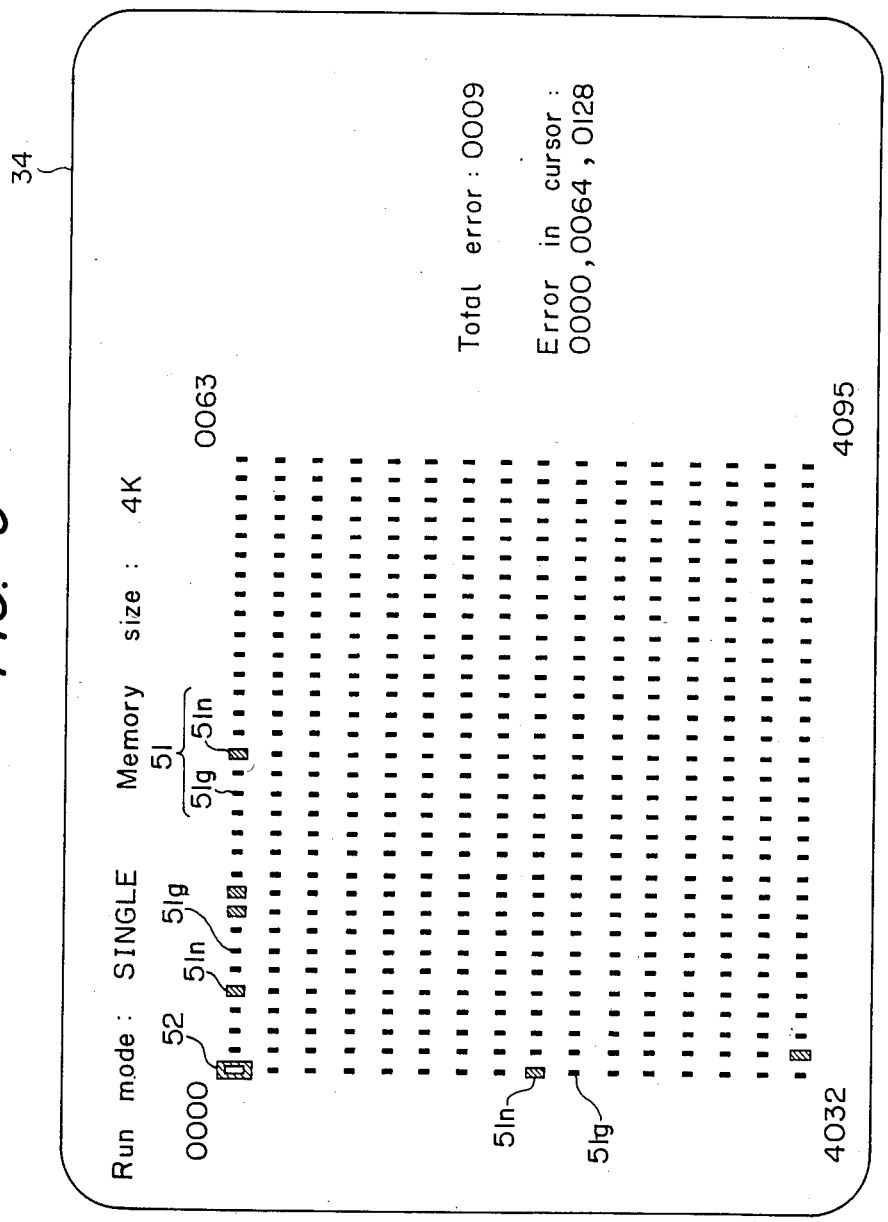

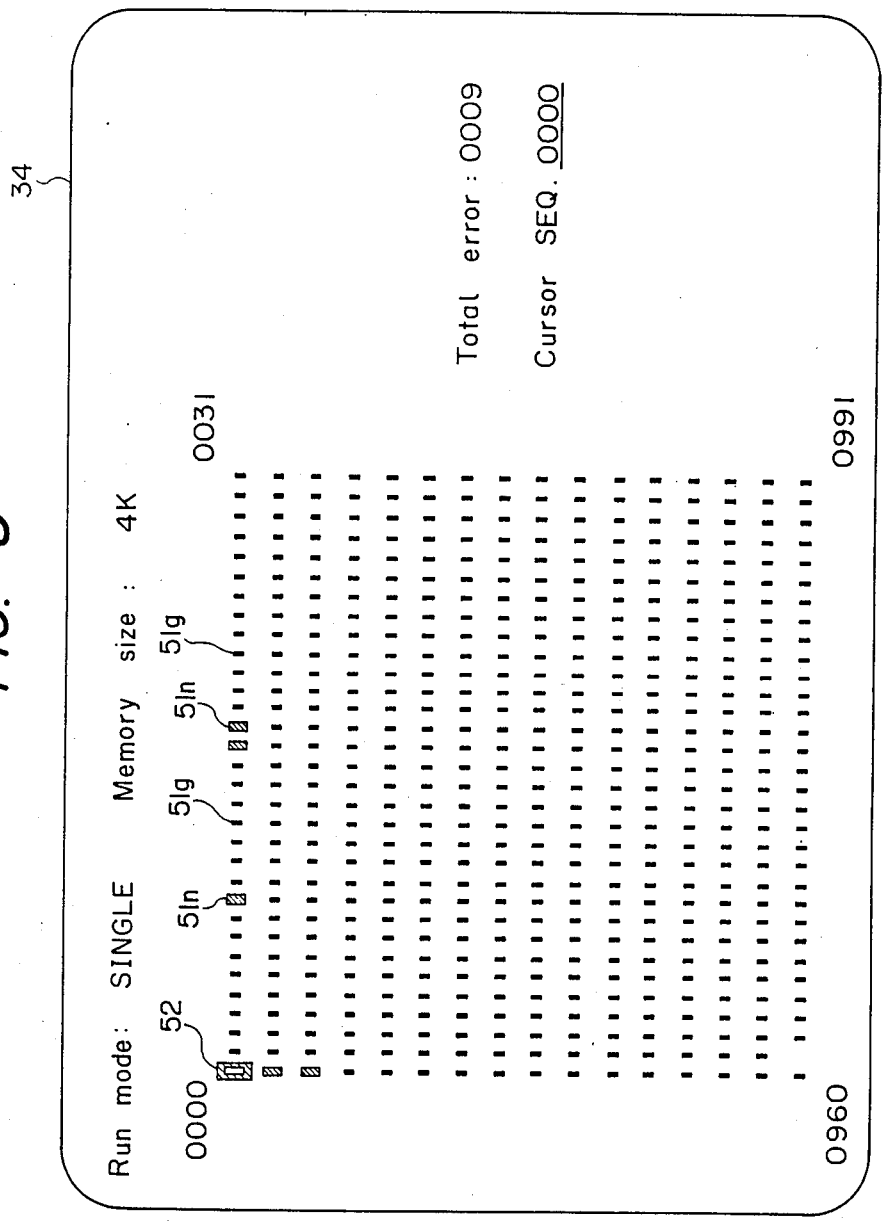

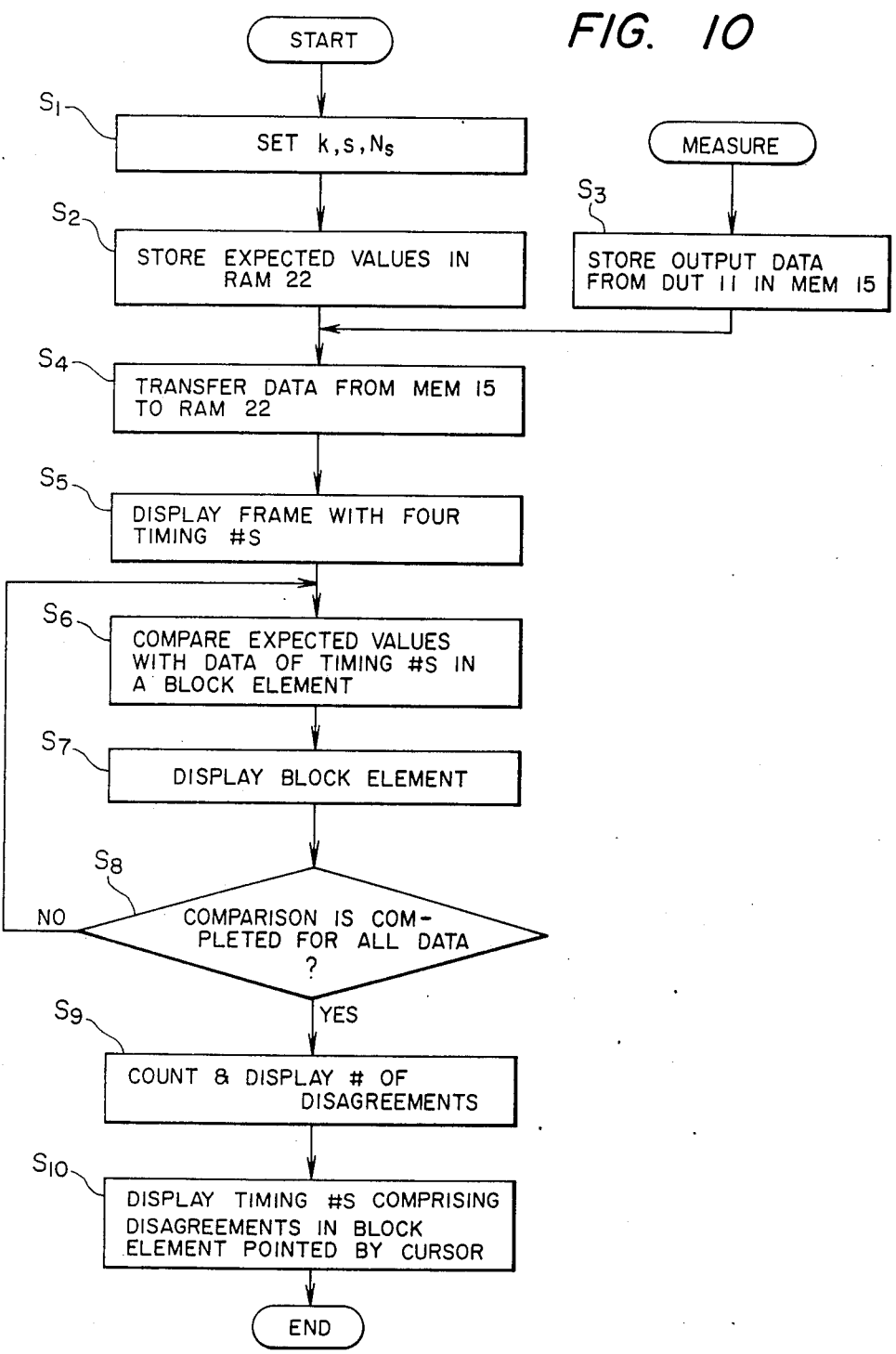

LOGIC ANALYZER

CROSS REFERENCE TO RELATED APPLICATIONS

This application is related to U.S. application Ser. No. 737,467.

BACKGROUND OF THE INVENTION

The present invention relates to a logic analyzer which is employed for analyzing the state of operation of a logic circuit in an apparatus which is operated, for example, by a microprocessor.

Heretofore, there has been proposed, for example, in U.S. Pat. Nos. 4,425,643 and 4,434,488, a logic analyzer of the type that sequentially inputs into a memory waveform output data simultaneously obtained from respective parts of a logic circuit and decides from the input data whether the logic circuit is normally operating or not.

In this kind of logic analyzer, predicted values, i.e. expected values, or output data obtained from a normally operating circuit are prestored as the expected values, and data obtained from a circuit under test is compared with the expected value for each state and when their mismatch is detected, it is decided that the circuit under test is defective.

For deciding only whether the circuit under test is non-defective or defective, it is necessary only to decide it as defective when one defective point is detected. In order to facilitate repair of the defective circuit, however, it is necessary to locate the malfunctioning portion. To meet this requirement, it is customary that data obtained from the circuit under test are displayed directly as logic values and that when a mismatch with the expected value is detected, a bright spot L is generated at the mismatched data position, indicating the occurrence of malfunction, as shown in FIG. 1. This method of display is called a list method. In this list, a numeric value field SEQ in the left-most column shows the timing numbers indicating the order of generation of output patterns, and the logic values in the respective columns at the right-hand side thereof show the data obtained from the circuit under test. GR0 and GR1 each show data of respective bits of eight channels, and GR2 data of respective bits of 16 channels. Each of GR3 and GR4 shows, in hexadecimal representation, four numbers each representing data of four binary bits corresponding to four channels. For example, A6A6 indicates 1010, 0110, 1010 and 0110, thus representing data of 16 channels in total.

In the case of adopting the list method, the list shown in FIG. 1 is a small part of the entire list, and in order to examine the comparison results of all patterns, the operator must observe the entire list while scrolling pages in the order of generation of the patterns. The number of patterns required for testing one circuit is about in the range of 1000 to 40000, though it differs with the scale of the circuit. Therefore, it is very laborious to effect eye inspection of 1000 to 40000 comparison results according to the list method.

Incidentally, there are cases where the circuit under test includes a part which operates at a relatively high frequency, that is, at a high speed, and a part which operates at a low speed. When high-speed and low-speed logic outputs are simultaneously obtained to be displayed, they must be input at a speed which permits correct observation of the high-speed output, and the inputting of the low-speed logic output at that speed results in unnecessarily much data being input. To avoid this, it is the general practice in the prior art to input the high-speed and low-speed logic outputs in different memories at speeds corresponding to their logic operation speeds, to read out the memories in accordance with the input speeds and to display the high-speed and low-speed logic outputs on the display screen of a display using the same time axis.

Conventionally, in such a case, the high-speed and low-speed logic outputs are sequentially arranged on the display screen in the order of output channels CH0 to CH7 of the circuit under test irrespective of the logic speeds of the input data, as shown in FIG. 2. A time axis LM is displayed at the lowermost position on the display screen. With this method of display, however, it cannot readily be known which waveform is the waveform of the high-speed or low-speed logic output. Accordingly, the operator must observe the individual displayed waveforms while judging from the signal input set state or the like whether the waveform is the high-speed or low-speed logic output for each channel. This is very inefficient.

SUMMARY OF THE INVENTION

It is therefore an object of the present invention to provide a logic analyzer which allows ease in locating a malfunctioning part of a circuit under test.

Another object of the present invention is to provide a logic analyzer which displays high-speed logic output waveforms and low-speed logic output waveforms in distinction from each other.

According to the present invention, data obtained from a circuit under test and the corresponding expected value are compared, and a plurality of such comparison results are displayed using one representative decision-indicator block element which differs depending upon whether a mismatch is present in the comparison results or not. Such representative decision-indicator block elements (hereinafter referred to simply as block elements) are displayed in an array, thereby displaying a large number of comparison results on one screen. By providing a display of the conventional list method in connection with the block element indicating the presence of a mismatch, the malfunctioning part can easily be located.

Further, according to the present invention, high-rate and low-rate logic outputs are input into different memories from the circuit under test at speeds suitable to them. The memories are read out in accordance with the high and low logic operation speeds, respectively, and displayed on the display screen of the same display using the same time axis. In this instance, the high-rate logic output waveform and the low-rate logic output waveform are displayed separately and a display is produced to indicate the position where they are separated.

BRIEF DESCRIPTION OF THE DRAWINGS

FIG. 1 is a diagram showing an example of a conventional list type display which displays comparison results of outputs from a circuit under test and expected values;

FIG. 6 is a diagram showing an example of a display of the results of comparison between the outputs of the circuit under test and the corresponding expected values in the logic analyzer of the present invention;

FIG. 8 is a diagram showing an example in which the number of the timing numbers included in one block element is made smaller than in the case of FIG. 6;

FIG. 10 is a flowchart showing an example of the operation for displaying the comparison results by the logic analyzer of the present invention;

DESCRIPTION OF THE PREFERRED EMBODIMENTS

Figure 3:
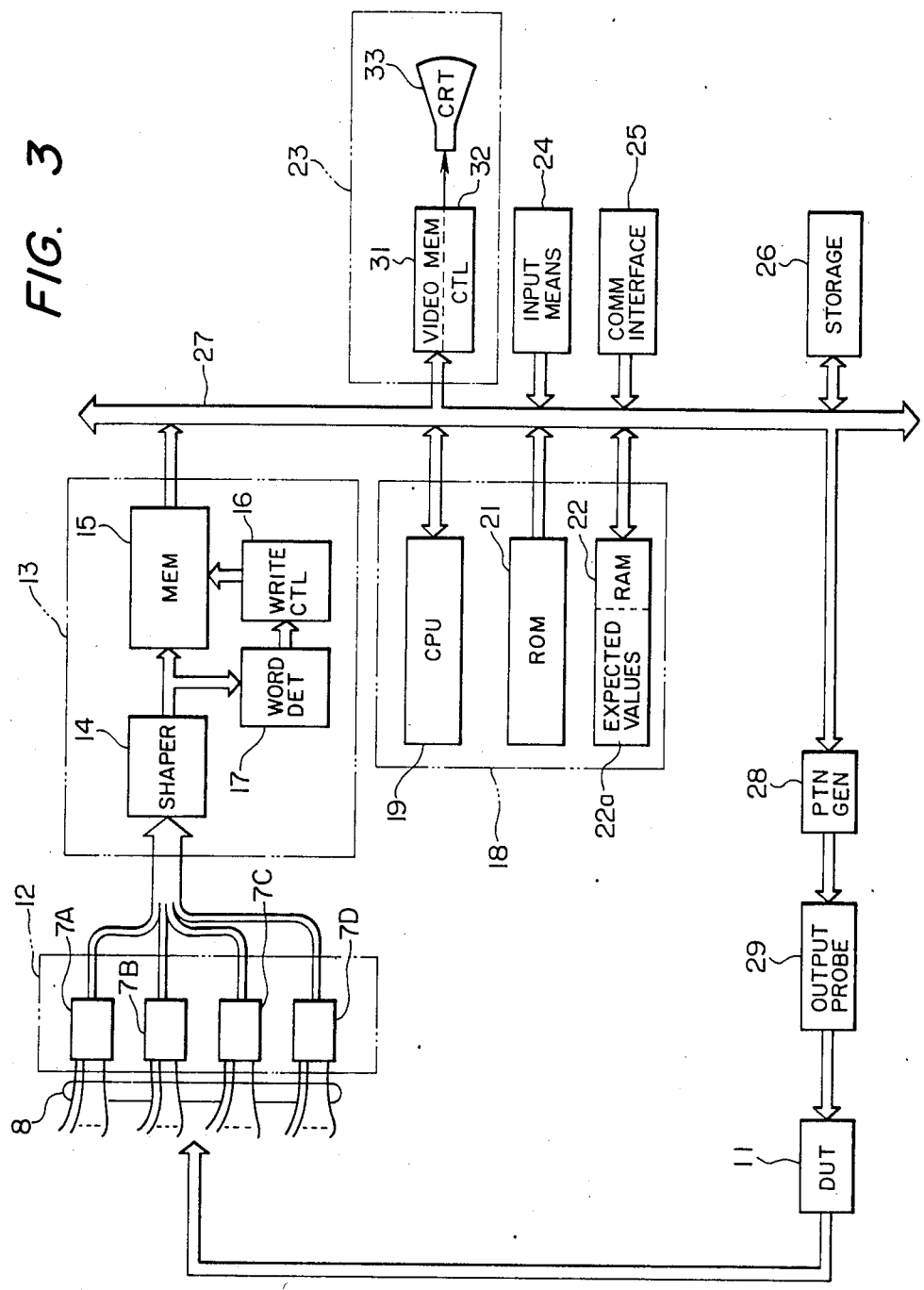
FIG. 3 is a block diagram illustrating an example of the logic analyzer of the present invention.

FIG. 3 illustrates an embodiment of the present invention. In FIG. 3, outputs from respective parts of a logic circuit device under test (DUT) 11 are applied to a data input unit 13 via probe 12 having a capacity of, for example, 64 channels. In the data input unit 13 the outputs of the circuit under test 11 are each decided by a waveform shaping circuit 14 in synchronism with a clock of this logic analyzer as to whether it is at the high or low level, and then it is input into a memory 15 while being normalized in timing. The memory 15 stores the outputs of the circuit under test 11 one after another under control of a write control circuit 16. A trigger word detector 17 has stored therein what is called a trigger word. Upon detection of the application thereto of the output of the circuit under test 11 which is of the same data as the trigger word, the trigger word detector 17 controls, after a certain elapsed time, the memory write control circuit 16 to stop the write in the memory 15.

A control unit 18, which is formed by a microcomputer, comprises a central processor (CPU) 19, a read only memory (ROM) 21 and a random access memory (RAM) 22. The ROM 21 has stored therein a program for operating the data input unit 13 and a display unit 23 in a predetermined order. The RAM 22 has stored therein setting data for various operations and expected values entered from input means 24 such as a keyboard.

The data input unit 13, the control unit 18, the display unit 23, the input means 24 and a communication interface 25 and a memory 26 such as a floppy disc, provided as required, are interconnected via a bus line 27. If desirable, it is also possible to connect a pattern generator 28 to the bus line 27 so that test pattern signals are generated by the pattern generator 28 and supplied to the respective parts of the circuit under test 11 via, for example, a 64-channel output probe 29.

The display unit 23 is made up of a video memory 31, a controller 32 for effecting a write in the video memory 31 and a scanning type display 33 such as a CRT. Data stored in the video memory 31 is repeatedly read out therefrom and displayed on the display 33.

Figure 4:
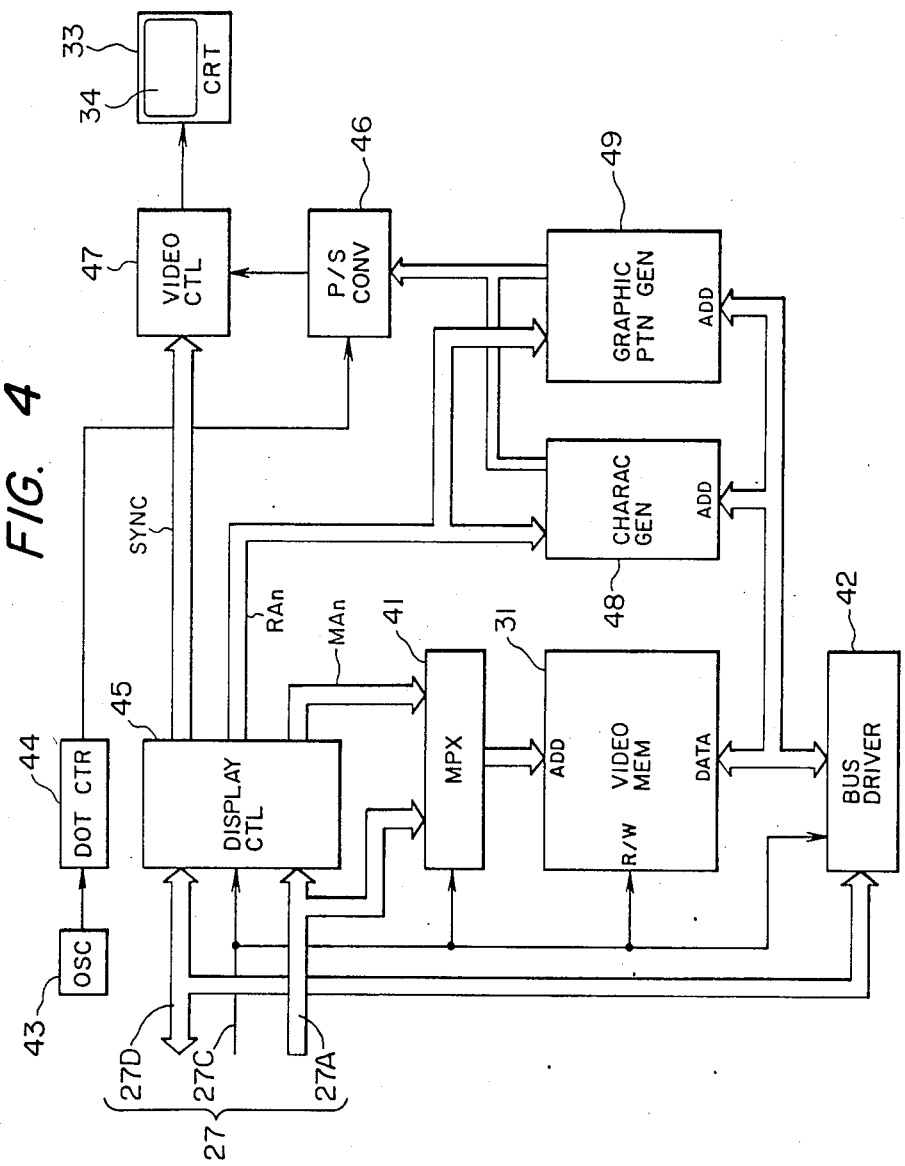
FIG. 4 is a block diagram showing a specific operative example of a display unit 23 used in FIG. 3.

The display unit 23 is arranged, for instance, as shown in FIG. 4. An address bus 27A of the bus line 27 is connected to a multiplexer 41, the output side of which is connected to the address input side of the video memory 31. A data bus 27D of the bus line 27 is connected via a bus driver 42 to a data terminal of the video memory 31. A control line 27C of the bus line 27 is connected to a control terminal of the multiplexer 41, a read/write control terminal of the video memory 31 and an input/output control terminal of the bus driver 42. A write in the video memory 31 from the control unit 18 (FIG. 3) is effected by providing on the data bus 27D a character, symbol or character code representing a graphic pattern segment desired to be written, by providing on the address bus 27A an address corresponding to the position on the screen of the scanning type display 33 where the display is desired to be produced and by providing a write command on the control line 27C. On the other hand, the output of a reference oscillator 43 is applied to a dot counter 44 to create a dot clock, which is provided to a display controller 45 and a parallel-serial converter 46. A synchronizing signal SYNC is supplied from the display controller 45 to a video controller 47, by which is effected scanning control of the display 33. A readout address MAn is generated by the display controller 45 in synchronism with the abovesaid synchronizing signal, and is applied via the multiplexer 41 to the video memory 31. The character code read out of the video memory 31 is provided as an address to each of a character pattern generator 48 and a graphic pattern generator 49. The pattern generators 48 and 49 have stored therein, as dot patterns, characters, symbols, graphic pattern segments and the like to be displayed, as in an ordinary character pattern generator. Based on the character code read out of the video memory 31 and the address provided from the display controller 45 in synchronism with the aforementioned synchronizing signal, the corresponding dot pattern is read out of the pattern generator 48 or 49 and then converted by the parallel-serial converter 46 to a serial dot pattern, which is applied as a display signal to the display 33 via the video controller 47. In this way, the characters, symbols, graphic pattern segments and so forth stored in the video memory 31 are displayed on the display screen 34 of the CRT 33. Incidentally, the write in the video memory 31 from the control unit 18 is effected in the vertical or horizontal blanking period of the display 33.

Figure 5A:
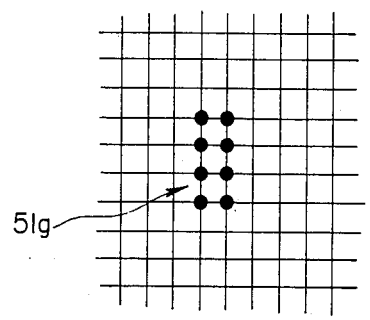
FIGS. 5A and B are diagrams showing examples of dot patterns of lock elements.
Figure 5B:
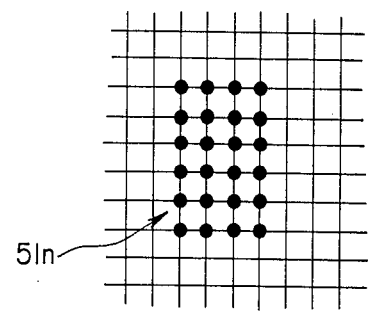

According to the present invention, a plurality of comparison results are displayed, on the display 33, as one representative decision-indicator block element which differs depending upon whether or not all the outputs of the circuit under test coincide with the corresponding expected values. In the case where one character is displayed, for example, as a pattern consisting of $8 \times 10$ dots, a block element 51g which indicates that all the outputs of the circuit under test coincide with the expected values is displayed in the form of such a small oblong dot pattern as shown in FIG. 5A, and a block element 51n which indicates that one or more of the outputs of the circuit under test do not coincide with the expected values is displayed in the form of such a larger oblong dot pattern as shown in FIG. 5B. The dot patterns of these block elements 51g and 51n (hereinafter identified simply by 51) are stored in the graphic pattern generator 49.

Figure 7:
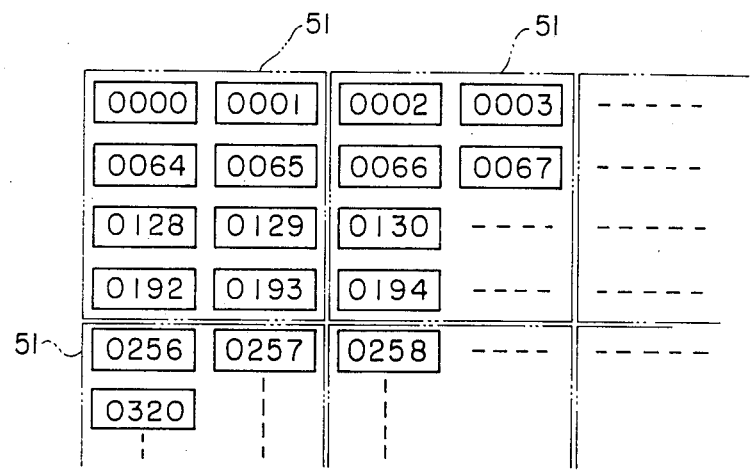
FIG. 7 is a diagram showing an example of the timing numbers included in one block element in FIG. 6.
Figure 9:
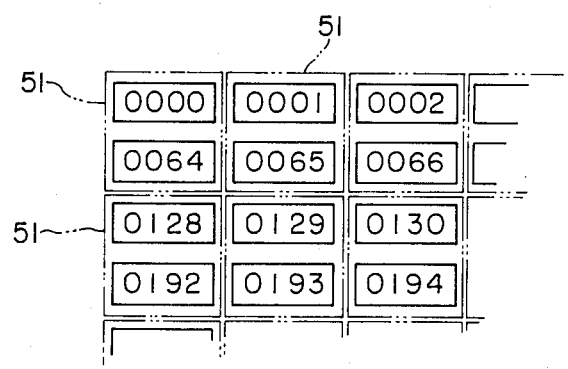
FIG. 9 is a diagram showing examples of the timing numbers included in one block element in FIG. 8.

Such block elements 51 are displayed, for instance, in a matrix form as shown in FIG. 6, on the screen 34 of the display 33, indicating a large number of comparison results. The number of comparison results that are represented by one block element is entered from the input means 24. For example, if an "8" is entered from the input means 24, each block element 51 will represent "8" comparison results. In this case, two columns by four rows of comparison results data are represented by one block element 51, as shown in FIG. 7. In FIG. 7, each of figures "0000", "0001", "0064", ... indicates the timing number representing comparison results for 64 channels shown in FIG. 1. Accordingly, when even one of 64×8=512 comparison results is a mismatch, the larger block element 51n is displayed.

Figure 1:
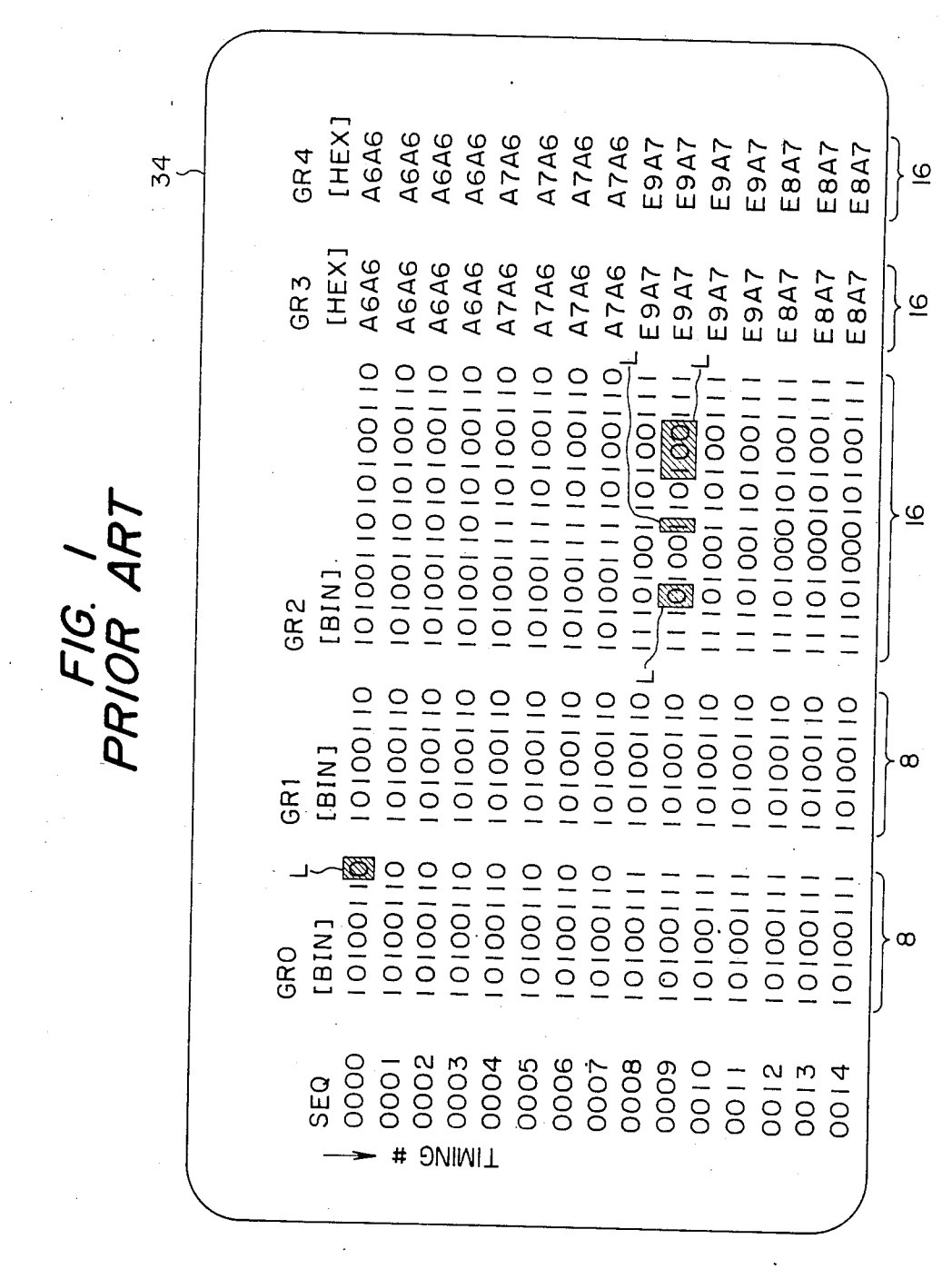

As shown in FIG. 7, the timing numbers in FIG. 1 are sequentially arranged in a (64×64) matrix form starting with the timing number "0000", and this arrangement of the timing numbers is divided into blocks, each including eight (two rows by four columns) timing numbers. The presence or absence of a mismatch in the data indicated by the eight timing numbers of each block is displayed by one representative decision-indicator block element 51, as shown in FIG. 6. The figures "0000", "0063", "4032" and "4095" at the four corners of the (16×32) matrix of the block elements 51 in FIG. 6 show the timing numbers at the four corners of the abovesaid matrix of the timing numbers. These figures indicate that the displays being provided are the comparison results for 4096 timing numbers from "0000" to "4095".

In FIG. 6, the presence of a mismatch in the comparison results of each block is indicated by the larger block element 51n. The total number of mismatches is displayed, for instance, in the form of "Total error: 0009" on the right of the arrangement of the block elements. By superimposing a cursor 52 on the block element 51n indicating the presence of a mismatch, those timing numbers in the block represented by the block element 51n to which mismatched data belong, "0000", "0064" and "0129" in this example, are displayed in the field of "Error in cursor".

By switching the form of display to that of the list method (FIG. 1) after this, the contents of the mismatches can be known in detail.

FIG. 8 shows an example into which the scale of display of the arrangement of the block elements is reduced. In this example, each block element 51 represents data of two timing numbers for two rows by one column. Accordingly, comparison results at a total of 992 timing points can be displayed. That is, in either of FIGS. 6 and 8, by setting the number m of the timing numbers represented by one block element 51 and the first timing number Ns of comparison results to be displayed, the maximum number of block elements that can be displayed, in this example, 16 (rows)×32 (columns)=512, is determined. Based on the number 512 of the block elements and the number m of the timing numbers, the number of the timing numbers of the comparison results to be displayed is 512×m, and consequently, comparison results corresponding to the 512×m timing numbers are displayed starting with the first timing number Ns. In the display on the reduced scale, it is also possible to cause comparison results of one timing number to correspond to one block element 51. In such a case, comparison results corresponding to 16×32=512 timing numbers are displayed on the entire display screen 34. Incidentally, the number of row p and the number of columns q in the arrangement of block elements are respectively equal to the number of rows of characters and the number of characters in one row in an ordinary character display.

FIG. 10 shows a flowchart of a program for performing the above-described operation. When the test mode is selected, it is requested in step $S_1$ to set the number k of the timing numbers in the lateral direction (in the row direction) on the display screen 34, the number s of the timing numbers in the vertical direction (in the column direction) in each character row and the first timing number Ns. The value of k is set to, for example, any one of 32, 64, 128 and 256. After setting the abovesaid data, step $S_2$ is performed, in which response outputs of the circuit under test in normal operation are obtained starting at a predetermined state and written as expected values in an area 22a of the RAM 22 of the control unit 18. In the case where the expected values have already been retained in some other file, they are transferred to the area 22a of the RAM 22.

After completion of the write of the expected values, the circuit under test 11 is connected to the logic analyzer to start the test. In step $S_3$ the response output of the circuit under test 11 is read into the memory 15. The number of data (the number of the timing numbers) M is predetermined. In step $S_4$ the response output of the circuit under test 11 is transferred to the RAM 22 of the control unit 18. In step $S_5$ the frame is displayed. That is, $Ns+(k-1)$, $Ns+k\times(S\times P-1)-1$ and $Ns+k\times S\times P-1$ are calculated, and the calculation results and Ns are displayed at the four corners of the arrangement of the block elements 51. In FIG. 6 there are shown respective numeric values in the case where $Ns=0000$, $k=64$ and $S=4$ ($P=16$). These displays are produced by storing character codes representing these figures in the memory 31 at addresses corresponding to the positions on the display screen 34 of the display 33 where they are to be displayed.

In step $S_6$ grouped data are compared with the corresponding expected values. That is, measured values of the timing numbers which are represented by the block element to be displayed at the first character position in the first row (in the first column) are compared with the corresponding expected values.

In step $S_7$, the character code representing the block element 51g or 51n, depending upon the presence or absence of a mismatch in the comparison results, is written into the video memory 31 at the address corresponding to its display position so that it is displayed on the display 33.

In step $S_8$ it is checked whether the comparison of all data has been completed, and if not, the process returns to step $S_6$, in which data of the timing numbers represented by the next block element are compared with the corresponding expected values and the same operation as described above is repeated. When the comparison of all data has been completed, the test will come to an end.

In step $S_9$ after the completion of the test, mismatched portions are retreived and the number of mismatches is displayed by the side of the arrangement of the block elements 51.

Superimposing the cursor 52 on the block element 51n indicating the presence of the mismatches, the timing numbers corresponding to the mismatched data in that block element 51n are all displayed under the display of the number of mismatches.

As described above, according to the present invention, since data comparison results of a plurality of timing numbers are displayed by one block element, a large number of comparison results can be displayed on one frame. This offers the advantage that mismatched portions can quickly be found out from many comparison results. By superimposing the cursor 52 on the larger block element 51n, the timing of the mismatched portion can be concretely displayed, and by switching the display to the display of the list method, the contents of the mismatched portion can be concretely be known. If necessary, some of the data obtained from the circuit under test 11 are displayed using the block elements, as shown in FIG. 8, but the number of the timing numbers that are represented by each block element can also be made smaller.

The manner of assigning the timing numbers to each block element is not limited specifically to the aforementioned manner. For instance, in the case of displaying the comparison results for eight timing numbers by one block element 51 as shown in FIG. 7, consecutive timing numbers, for example, "0000", "0001", "0002", ... and "0007", can also be assigned to each block element 51. Further, while in the above the smaller block element 51g indicating the absence of a mismatch and the larger block element 51n indicating the presence of a mismatch are distinguished in the form of display, it is also possible to discriminate the block element 51n by blinking or in a color different from that of the other block element 51g. Incidentally, by specifying the attribute of a character provided in a controller of a commercially available CRT display, an inverted image or blinking can readily be obtained. Moreover, the data that is read into the memory 15 for comparison with the expected values is not limited specifically to the output data of the circuit under test 11 which is obtained when it is supplied with the test pattern signal from the pattern generator 28, but it may also be the output data of the circuit under test 11 when it is started under a specific condition.

Figure 11:
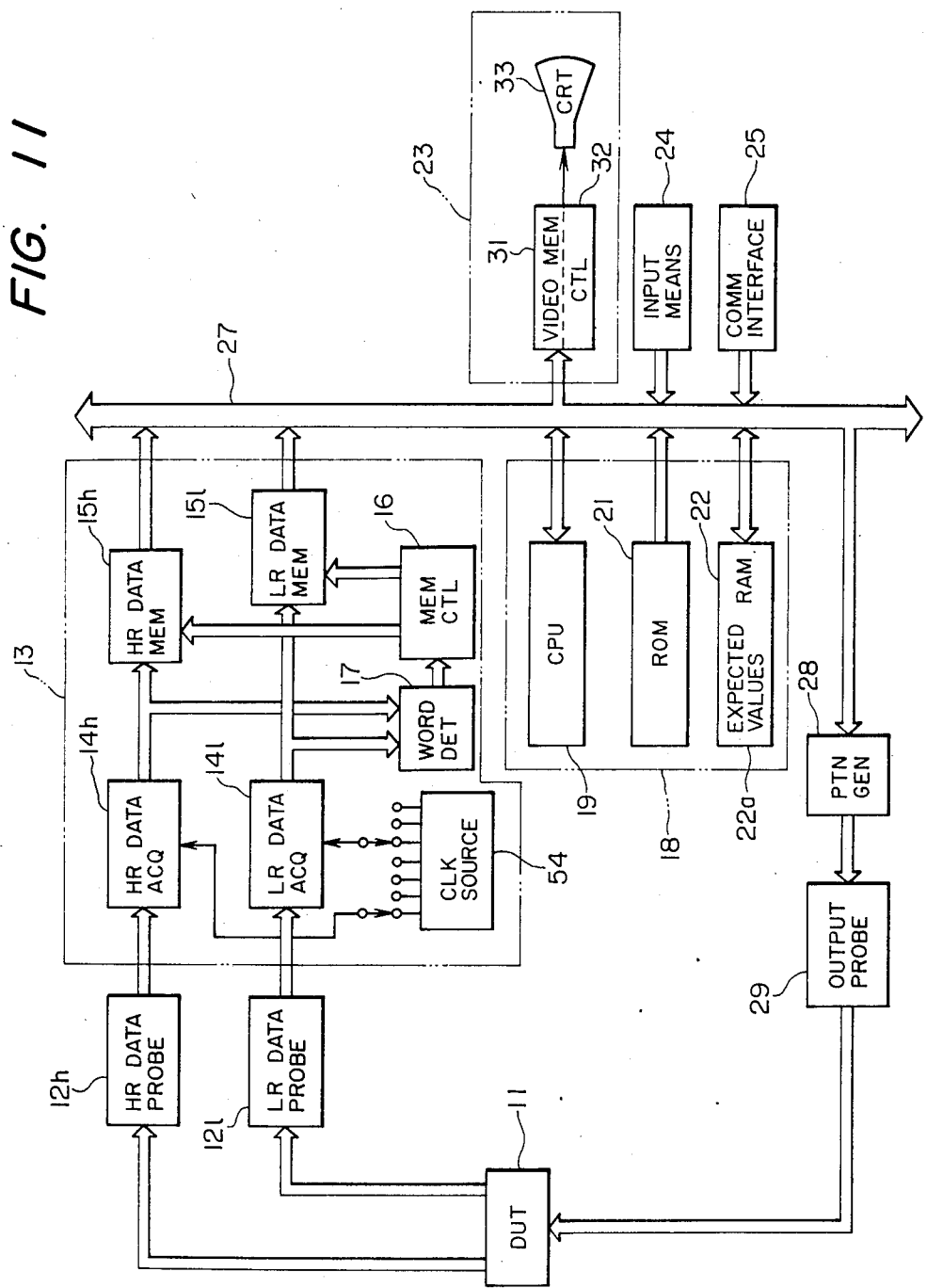
FIG. 11 is a block diagram illustrating an example of the logic analyzer in the case where high-speed and low-speed logic outputs are obtained from the circuit under test.

Sometimes the circuit under test 11 yields a high data-rate, i.e. a high-speed and a low data-rate, i.e. a low-speed output. In such an instance, signals of, for example, 16 channels and signals of 48 channels are respectively obtained by high-rate and low-rate probes 12h and 12l from the circuit under test 11, as shown in FIG. 11 in which like parts corresponding to those in FIG. 3 are identified by the same reference numerals.

The high-rate probe 12h extracts a high-rate logic signal from the circuit under test 11 and inputs it into high-rate signal acquisition circuit 14h. The high-rate signal acquisition circuit 14h decides, by comparison, whether the input logic signals are at predetermined H and L logic levels, and at the same time, it receives from a clock source 54 a high-speed clock of a frequency corresponding to the speed of the high-rate logic signals, normalizes the high-rate logic signals and applies the normalized outputs to a high-rate memory 15h, writing thereinto the high-rate logic signals.

The low-rate probe 12l extracts low-rate logic signal from the circuit under test 11 and provides it to a low-rate signal acquisition circuit 14l. The low-rate signal acquisition circuit 14l decides, by comparison, whether the input logic signals are at predetermined H and L logic levels, and at the same time, it receives from the clock source 54 a low-speed clock of a frequency corresponding to the speed of the low-rate logic signals, normalizes the low-rate logic signals and applies the normalized outputs to a low-rate memory 15l, thus writing thereinto the low-rate logic signals.

The trigger word detector 17 detects a predetermined trigger word from the input signals, and a preset delay time after the detection of the trigger word, effects control of finishing the write in the memories 15h and 15l. The memory control circuit 16 generates addresses for the memories 15h and 15l in synchronism with the high-speed and low-speed clocks which are applied to the signal acquisition circuits 14h and 14l, respectively. A write end control signal from the trigger word detector 17 stops the updating of each address of the memory control circuit 16.

According to the present invention, the high-rate and low-rate logic signals read into the high-rate and low-rate memories 15h and 15l are displayed in separate groups on the display unit 23. This grouping is carried out by the control unit 18. That is, when the number of each channel desired to displayed is entered from the input means 24, logic signals of the channel number are read out of the high-rate and low-rate memories 15h and 15l and transferred to the video memory 31. At this time, the logic signal data read out of the high-rate memory 15h is written into the video memory 31 at a high-order address corresponding to an upper character row on the display screen 34 of the display 33, and the logic signal data read out of the low-rate memory 15l is written into the video memory 31 at a low-order address corresponding to a lower character row on the display screen 34 of the display 33. When all the logic signals to be displayed happen to be logic signals read out of the low-rate memory 15l, the low-rate logic signals to be displayed are written in the video memory 31 at lower-order addresses starting with the higher-order address.

In the illustrated example, the logic signals read out of the high-rate memory 15h and the logic signals read out of the low-rate memory 15l are separately displayed on the display screen 34, and to this end, a scale mark LM is used.

Figure 2:
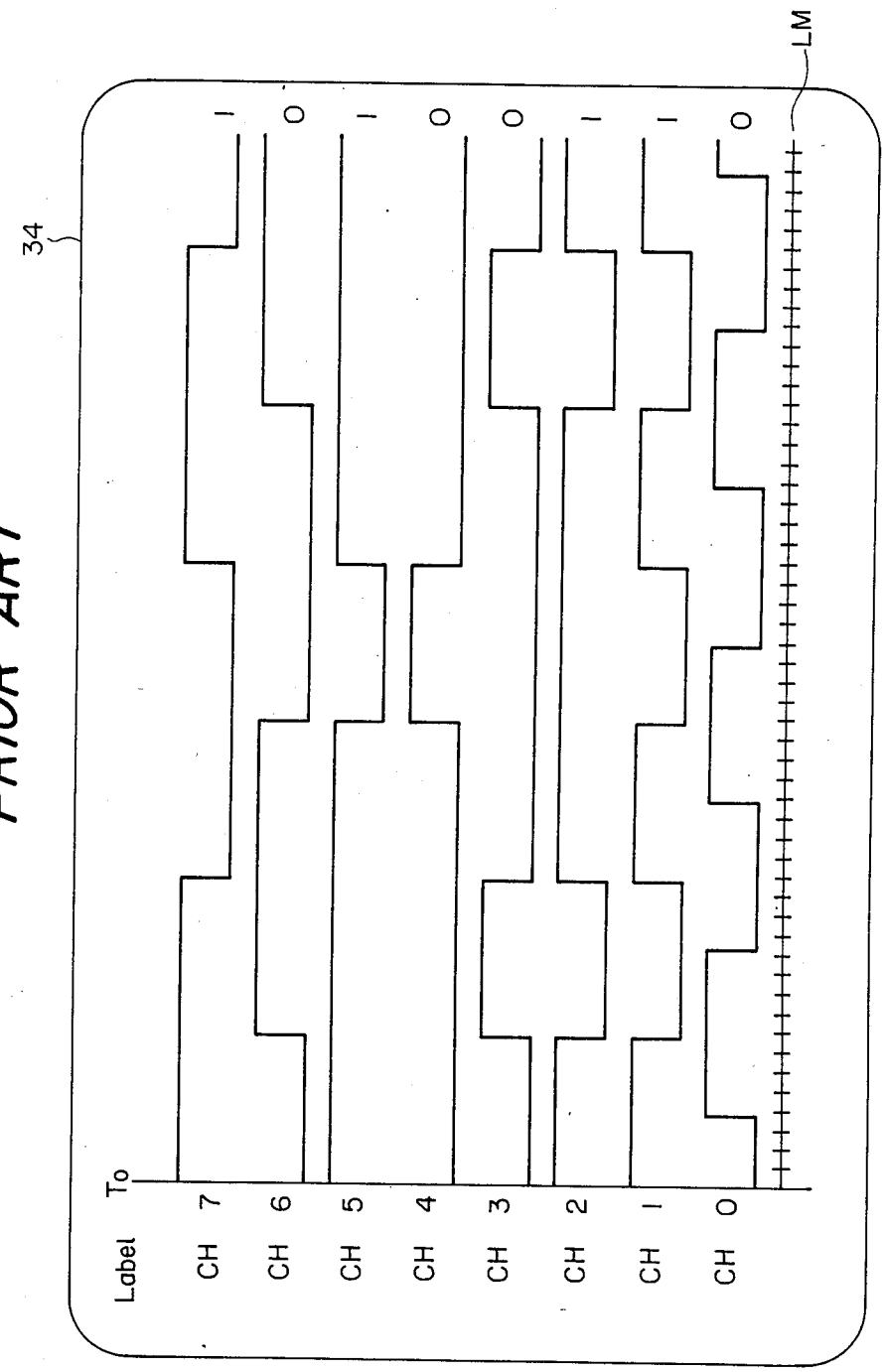
FIG. 2 is a diagram showing an example of a conventional display which displays as waveforms, the outputs of the circuit under test.

In the case of displaying only one of the groups of logic signals read out of the high-rate memory 15h (hereinafter referred to as a group A) and logic signals read out of the low-rate memory 15l (hereinafter referred to as a group B), the scale mark LM for separating the groups is displayed at the lowermost position in the same manner as in the past, as shown in FIG. 2.

Figure 12:
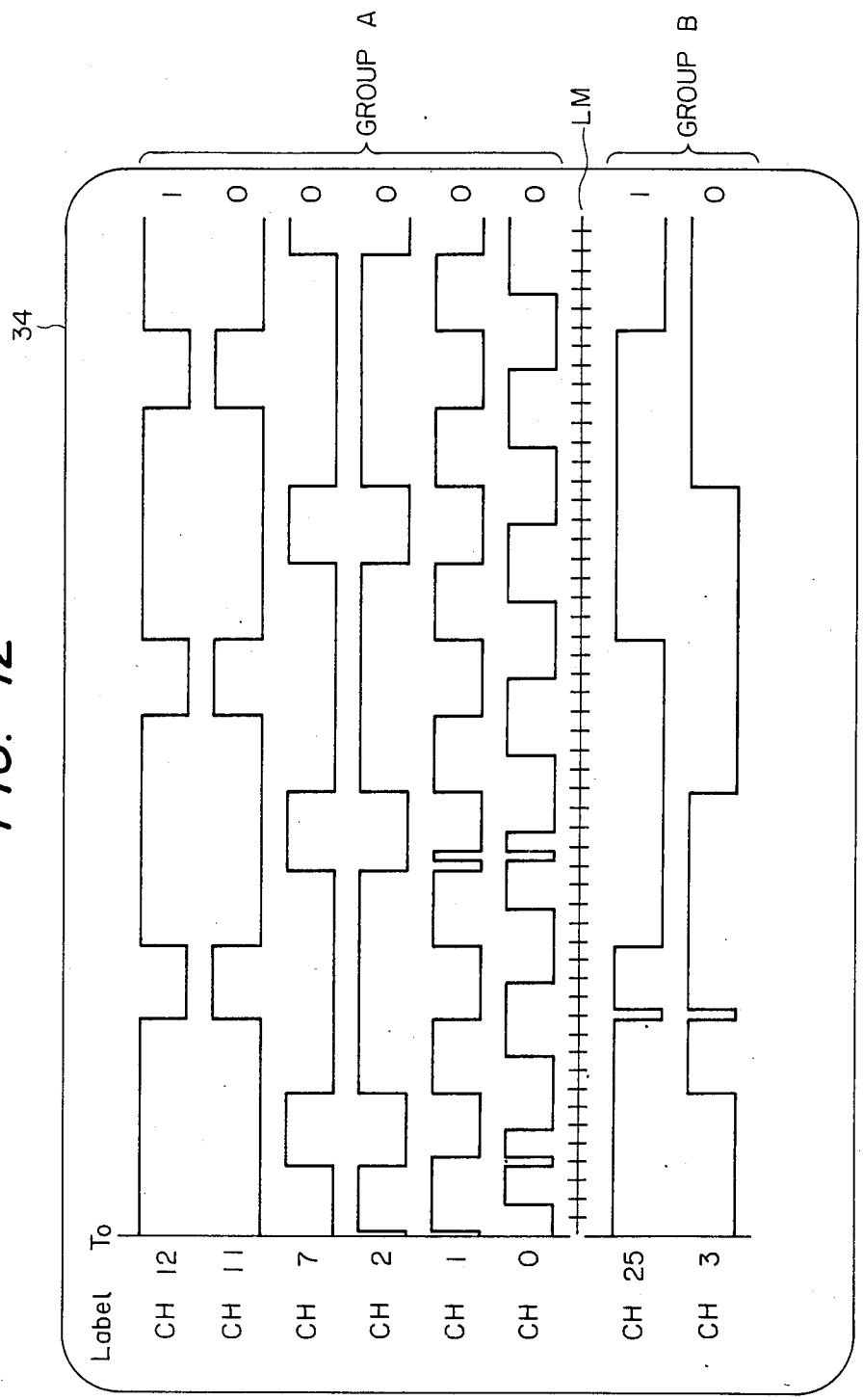
FIG. 12 is a diagram showing, by way of example, high-speed and low-speed logic output waveforms in the logic analyzer of the present invention.

FIG. 12 shows an example in which the both groups are displayed together on the same display screen 34. In this example, the group A is displayed for six channels and the group B for two channels. The scale mark LM is displayed between the groups A and B.

Figure 13:
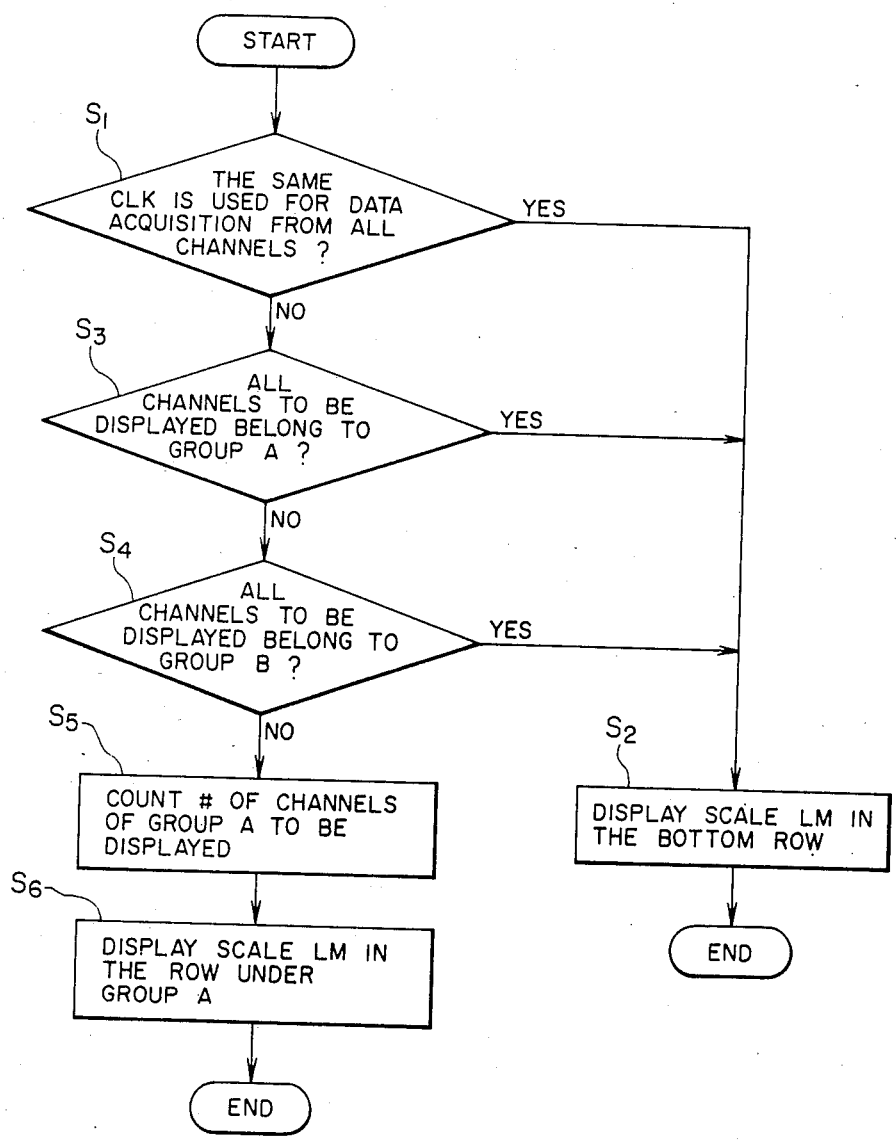
FIG. 13 is a flowchart showing an example of the operation for providing separate displays of high-speed and low-speed logic output waveforms in the logic analyzer of the present invention.

The position where the scale mark LM is displayed is decided by the control unit 18. FIG. 13 shows a flowchart of a program for making the decision. In step $S_1$ it is checked whether input channels are based on the same clock or not. If so, the scale mark LM is displayed, in step $S_2$, at the row next to the waveform to be displayed on the display screen, that is, at the lowermost position on the display screen.

When the input channels are not based on the same clock, a check is made in step $S_3$ to determine whether the channels to be displayed all belong to the group A or not. If so, the scale mark LM is displayed at the lowermost position on the display screen in step $S_2$.

When all the channels to be displayed do not belong to the group A, it is checked in step S₄ whether they belong to the group B alone. If so, the scale mark LM is displayed at the lowermost position on the display screen in step S₂.

When all the channels to be displayed do not belong to the group B, the number of channels of the group A that are to be displayed is detected in step S₅, and in step S₆ the scale mark LM is displayed at the row next to the number of channels detected, thus completing the processing. This series of operations are performed by the control unit 18.

As described above, according to the present invention, a plurality of logic waveforms to be displayed on the display unit 23 are divided into different groups according to speed, and, for example, the scale mark LM is displayed between the groups. Accordingly, whether the waveforms being displayed are high-rate or low-rate signals can be known immediately depending upon whether they are being displayed above or below the scale mark LM. This separate display can be achieved using not only the scale mark but also some other means. Further, the logic waveforms to be displayed may also be divided into three or more groups.

It will be apparent that many modifications and variations may be effected without departing from the scope of the novel concepts of the present invention.

What is claimed is:

1. A logic analyzer for a circuit under test having plurality of output channels, comprising:
   data storage memory means, coupled to the circuit under test, for sequentially storing a plurality of output data simultaneously obtained from the plurality of output channels of the circuit under test in response to respective input data supplied to the circuit under test;
   expected value memory means for storing expected value data corresponding to the expected values of said output data;
   comparison means, operatively connected to said data stoage memory means and said expected value memory means, for comparing said output data from said data storage memory means with the corresponding expected value data stored in the expected value memory means
   code producing means for producing character codes of block elements each representing plural input and output bits being compared and indicating whether there is any mismatch in each block of a predetermined number of the data patterns;
   display means, of a scanning type and including a display screen, for displaying dot patterns of block elements and characters on the display screen;
   video memory means for storing character codes representing the respective block elements and characters at addresses corresponding to respective positions of display on said display screen and reading therefrom the character codes in synchronism with scanning of said display means;
   dot pattern memory means having stored therein dot patterns of the block elements and characters, for receiving the character codes read out from said video memory means and reading the dot patterns of the block elements and characters using the character codes as addresses; and
   control unit means for writing the character codes of the block elements and characters into said video memory means at the addresses corresponding to the positions on said display screen such that the block elements are displayed in matrix form and the characters are displayed around the matrix on said display sceen.

2. The logic analyzer of claim 1, wherein said analyzer further comprises input means for specifying an input timing number corresponding to one of the data patterns, and said control unit means includes means for changing over display from the matrix form of the block elements to a list of logic values of a predetermined number of the respective data patterns accompanied by corresponding input timing numbers in the order thereof with an indication of mismatch placed on each logic value in each data pattern having caused the mismatch with the corresponding expected value, and means for supplying, to said video memory means, character codes of data values of the predetermined number of data patterns to be displayed in the list corresponding to successive input timing numbers including the specified input timing number.

3. The logic analyzer of claim 1, wherein said analyzer further comprises input means for specifying one of the displayed block elements, and said control unit means includes means for providing, to said video memory means, character codes of input timing numbers corresponding to the mismatched data patterns belonging to the specified block element to be displayed on said display screen.

4. The logic analyzer of claim 1, wherein said analyzer further comprises means for specifying an input timing number corresponding to one of the data patterns, means for presetting the predetermined number of the data patterns to be represented by each block element and means for presetting the number of the block elements to be displayed in matrix form on said display screen, and said control unit means comprises means for selecting successive data patterns of a number determined by the preset number of the data patterns and the present number of the block elements, starting with the data pattern of the specified input timing number and supplying the character codes of the block elements representing the selected data patterns to said video memory means.

5. The logic analyzer of claim 1, wherein said control unit means comprises means for providing, to said video memory means, character codes of the input timing number corresponding to the block elements at four corners of the matrix on said display screen so that the four input timing numbers are displayed in the vicinity of the corresponding four block elements at the four corners.

6. The logic analyzer of claim 1, wherein said analyzer further comprises high and low rate data acquisition means for receiving high rate data of parallel bits and low rate data of parallel bits simultaneously from the channel outputs of said circuit under test, wherein said data storage memory means comprises high and low rate data memory means for successively storing therein the high and low rate data from said high and low rate data acquisition means in synchronism with high and low rate clocks, respectively, said dot pattern memory means comprises graphic memory means having stored therein graphic patterns for reading out therefrom the graphic patterns using the character codes from said video memory means as addresses, and said control unit means comprises means for providing, to said video memory means, character codes of graphic patterns representing respective portions of waveforms of the high and low rate data of selected ones of said channel outputs and a partition mark so that the waveforms corresponding to the high and low rate data are displayed in separate groups on said display screen and said partition mark is displayed between the two groups.

7. The logic analyzer of claim 6, wherein said control unit means comprises means for providing, to said video memory means, character codes of channel numbers corresponding to said selected channel outputs of said logic circuit under test so as to be displayed on said display screen, and said control unit means controls to display said partition mark at the lowermost position below all the displayed waveforms when said selected channel outputs are all of the same data rate.

8. A logic analyzer according to claim 6 or 7, wherein the partition mark is used as a time axis scale for the displayed waveforms.

9. A logic analyzer, comprising:
control means for comparing a sequence of output data on a plurality of output channels of a device under test with respective expected value data corresponding to input data supplied on a plurality of input channels to the device at a respective timing sequence for said device under test, and
display means, responsive to the comparison by said control means, for displaying block elements on a display, each block element representing plural compared input and output bits and indicating whether all of a respective part of said output data agrees with the respective expected value data, and
said control means including means for determining how much of said output data corresponds to each block element, and how much of the timing sequence is to be represented by display of the block elements.

10. The analyzer of claim 9, wherein waveforms corresponding to said output data are selectively displayed on said display screen.

11. The analyzer of claim 10, further comprising means for separately storing in different memories said output data from said plurality of output channels according to a data rate of the respective parts of said output data.

12. The analyzer of claim 11 wherein said selectively displayed waveforms corresponding to different ones of said data rates are grouped in separate respective groups on said display.

* * * * *

UNITED STATES PATENT AND TRADEMARK OFFICE
CERTIFICATE OF CORRECTION

PATENT NO. : 4,696,004
DATED : September 22, 1987
INVENTOR(S) : NAKAJIMA ET AL.

It is certified that error appears in the above-identified patent and that said Letters Patent is hereby corrected as shown below:

Column 3, line 6, "lock" should be --block--.

Column 8, line 22, after "to" insert --be--.

Column 10, line 5, "sceen" should be --screen--.

On cover page, second column:

should be --12 Claims, 14 Drawing Figures--.

Signed and Sealed this

Eighth Day of March, 1988

Attest:

DONALD J. QUIGG

Attesting Officer      Commissioner of Patents and Trademarks